United States Patent

Goyal et al.

(10) Patent No.: US 12,034,132 B2
(45) Date of Patent: Jul. 9, 2024

(54) METHOD FOR CONTROLLING AND REGULATING A RECHARGEABLE BATTERY

(71) Applicant: Hilti Aktiengesellschaft, Schaan (LI)

(72) Inventors: Varnim Goyal, Kaufering (DE); Bernd Ziegler, Schwabmuenchen (DE)

(73) Assignee: Hilti Aktiengesellschaft, Schaan (LI)

( * ) Notice: Subject to any disclaimer, the term of this patent is extended or adjusted under 35 U.S.C. 154(b) by 147 days.

(21) Appl. No.: 17/763,443

(22) PCT Filed: Oct. 6, 2020

(86) PCT No.: PCT/EP2020/077934
§ 371 (c)(1),
(2) Date: Mar. 24, 2022

(87) PCT Pub. No.: WO2021/073937
PCT Pub. Date: Apr. 22, 2021

(65) Prior Publication Data
US 2022/0407130 A1 Dec. 22, 2022

(30) Foreign Application Priority Data

Oct. 16, 2019 (EP) .................................... 19203637

(51) Int. Cl.
*H01M 10/48* (2006.01)
*G01R 31/3835* (2019.01)
(Continued)

(52) U.S. Cl.
CPC ...... *H01M 10/482* (2013.01); *G01R 31/3835* (2019.01); *G01R 31/396* (2019.01);
(Continued)

(58) Field of Classification Search
None
See application file for complete search history.

(56) References Cited

U.S. PATENT DOCUMENTS

2011/0248679 A1* 10/2011 Tien ..................... H02J 7/0016
320/120
2016/0211677 A1 7/2016 Kobayashi et al.

FOREIGN PATENT DOCUMENTS

DE 102017003635 A1 10/2018

OTHER PUBLICATIONS

International Search Report of PCT/EP2020/077934, dated Dec. 18, 2020.

* cited by examiner

*Primary Examiner* — Jas A Sanghera
(74) *Attorney, Agent, or Firm* — Davidson Kappel LLC

(57) ABSTRACT

Method for controlling and regulating a rechargeable battery having energy storage cells, control electronics, a voltage measurement device and a sensor device, wherein the sensor device and the energy storage cells are respectively connected to one another via at least one controllable switching element so that electrical energy can be conducted from the energy storage cells to the sensor device. The method includes: capturing a first voltage value of the first and second energy storage cells of the voltage measurement device, and adjusting the at least one switching element from a deactivation mode to an activation mode if the difference between the voltage value of the first energy storage cell and the voltage value of the second energy storage cell reaches a predetermined threshold value, in order to conduct electrical voltage from the energy storage cell with the higher voltage value to the sensor device.

8 Claims, 4 Drawing Sheets

(51) Int. Cl.
*G01R 31/396* (2019.01)
*H01M 10/0525* (2010.01)
*H01M 10/42* (2006.01)
*H01M 10/44* (2006.01)
*H02J 7/00* (2006.01)

(52) U.S. Cl.
CPC ... *H01M 10/0525* (2013.01); *H01M 10/4257* (2013.01); *H01M 10/441* (2013.01); *H02J 7/0013* (2013.01); *H02J 7/0047* (2013.01); *H01M 2010/4271* (2013.01)

METHOD FOR CONTROLLING AND REGULATING A RECHARGEABLE BATTERY

The present invention relates to a method for controlling and regulating a rechargeable battery having at least one first and one second energy storage cell, control electronics, a voltage measurement device and at least one sensor device, wherein the sensor device and the energy storage cells are respectively connected to one another via at least one controllable switching element in such a manner that electrical energy can be conducted from the energy storage cells to the sensor device.

BACKGROUND

Modern rechargeable batteries contain a multiplicity of energy storage cells which can also be referred to as galvanic cells or rechargeable battery cells. In addition, a modern rechargeable battery usually also has a battery management system in order to monitor and regulate the functions and processes inside the rechargeable battery. A balancer is often an important part of the battery management system. The task of the balancer is to ensure that electrical charge is distributed as uniformly as possible over all energy storage cells. However, balancers of energy storage cells in rechargeable batteries according to the prior art are often inefficient.

SUMMARY OF THE INVENTION

It is an object of the present invention to provide a method for controlling and regulating a rechargeable battery, which method can be used to improve the balancing and/or the uniform charge distribution in the energy storage cells of a rechargeable battery.

The present invention provides a method for controlling and regulating a rechargeable battery having at least one first and one second energy storage cell, control electronics, a voltage measurement device and at least one sensor device, wherein the sensor device and the energy storage cells are respectively connected to one another via at least one controllable switching element in such a manner that electrical energy can be conducted from the energy storage cells to the sensor device.

According to the invention, the method comprises the method steps of:
capturing a first voltage value of the first and second energy storage cells by means of the voltage measurement device; and
adjusting the at least one switching element from a deactivation mode to an activation mode if the difference between the voltage value of the first energy storage cell and the voltage value of the second energy storage cell reaches a predetermined threshold value, in order to conduct electrical voltage from the energy storage cell with the higher voltage value to the sensor device.

According to an advantageous embodiment of the present invention, it may be possible for the method to comprise the method step of:
capturing a second voltage value of the first and second energy storage cells by means of the voltage measurement device after expiry of a first period.

This makes it possible to regularly or irregularly monitor and/or regularly capture the voltage value of the individual energy storage cells in order to initiate a balancing process, if necessary, and to uniformly distribute the charge in the energy storage cells of a rechargeable battery.

According to an advantageous embodiment of the present invention, it may be possible for the method to comprise the method step of:
capturing a second voltage value of the first and second energy storage cells by means of the voltage measurement device after expiry of a second period, wherein the second period depends on a difference value between the voltage value of the first energy storage cell and the voltage value of the second energy storage cell.

This makes it possible to adapt the monitoring or the capture of the voltage value of the individual energy storage cells to how quickly or slowly the electrical charge in the individual energy storage cells varies from one another.

The switching element may be a metal oxide semiconductor field effect transistor (MOSFET) or another suitable field effect transistor (FET).

Further advantages can be found in the following description of the figures. Various exemplary embodiments of the present invention are shown in the figures. The figures, the description and the claims contain numerous features in combination. A person skilled in the art will expediently also consider the features individually and combine them into useful further combinations.

DETAILED DESCRIPTION

Figure 1:
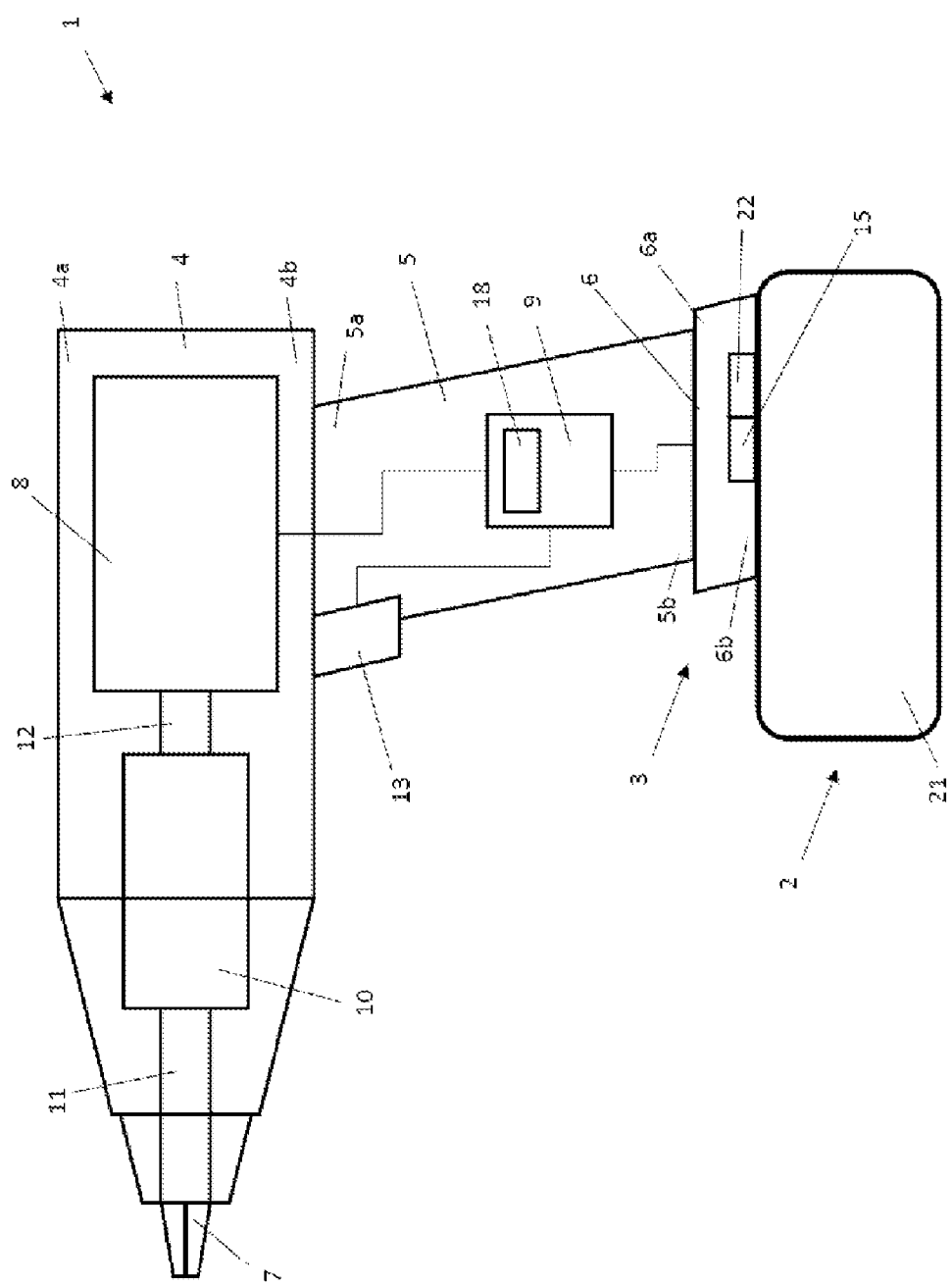
FIG. 1 shows a side view of a power tool having a rechargeable battery for carrying out the method according to the invention.

FIG. 1 illustrates a power tool 1 and a rechargeable battery 2. The power tool 1 is illustrated in the form of a rechargeable battery-operated screwdriver. According to other alternative embodiments, the power tool 1 may also be designed in the form of a power drill, a saw, a grinder or the like.

The rechargeable battery 2 is connected to the power tool 1 via an interface 3 and is used to supply the electrical loads of the power tool 1 with electrical energy. During the supply, electric current flows from the rechargeable battery 2 to the power tool 1.

The power tool 2 designed as a rechargeable battery-operated screwdriver substantially comprises a housing 4, a handle 5, a base part 6, a tool fitting 7, an electrical drive 8 in the form of an electric motor, a controller 9, a transmission 10, an input shaft 11, an output shaft 12 and an activation switch 13. The electric motor may be a brushless electric motor.

The electrical drive 8 designed as an electric motor, the transmission 10, the input shaft 11, the output shaft 12 and the controller 9 are positioned in the housing 4. The drive 8, the transmission 10, the input shaft 11 and the output shaft 12 are positioned in relation to one another and in the housing 10 such that a torque generated by the drive 8 is transmitted to the output shaft 12. The output shaft 12 transmits the torque to the transmission 10, which in turn passes on a torque to the input shaft 11. The tool fitting 7 is driven by way of the input shaft 11 by the transmission of the torque. As illustrated in FIG. 1, a tool in the form of a bit is held in the tool fitting 7. By means of the bit, a screw can be screwed into a material.

As also shown in FIG. 1, the housing 4 comprises an upper side 4*a* and an underside 4*b*. The handle 5 comprises a first end 5*a* and a second end 5*b*. The first end 5*a* of the handle 5 is secured to the underside 4*b* of the housing 4. Furthermore, the base part 6 comprises an upper end 6*a* and a lower end 6*b*. The upper end 6*a* of the base part 6 is secured to the second end 5*b* of the handle 5. The lower end 6*b* of the base part 6 comprises an interface 15 and is used to mechanically, electrically and electronically connect the power tool 2 to the rechargeable battery 2. In this case, the connection is releasable again.

In order to receive electrical energy (or electric current), the interface 15 comprises a number of power connections. The interface 15 also comprises data connections for transmitting and receiving information and data in the form of signals.

As can be gathered from FIG. 1, the controller 9 of the power tool 1 is positioned in the handle 5 of the power tool 1. The controller 9 of the power tool 1 serves for the control and regulation of various processes in relation to the power tool 1 and in relation to the rechargeable battery 2. The controller 9 controls in particular the current or the intensity of the current that flows from the rechargeable battery 2 to the power tool 1, and in particular is used for driving the drive 8 formed as an electric motor. Furthermore, the controller 9 is also used to capture the electrical voltage which is applied by the rechargeable battery.

In this case, the controller 9 of the power tool 2 comprises a microcontroller 18 (also referred to as MCU) and a data interface as part of a communication circuit for bilateral communication between the rechargeable battery 2 and the power tool 1. Neither the data interface nor the communication circuit is illustrated in the figures.

The rechargeable battery 2 comprises substantially a housing 21 with a rechargeable battery interface 22 and a multiplicity of energy storage cells 23. (See, e.g., FIG. 2). The energy storage cells 23, control electronics 24 with a microcontroller 25, a voltage measurement device 26 and a sensor device 27 are positioned in the housing 21 of the rechargeable battery 2.

The sensor device 27 may be, for example, an acceleration sensor, a GPS sensor (Global Positioning System sensor), a gyro sensor, a temperature sensor or another sensor which requires a virtually continuous supply with electrical energy for a proper and permanent function.

The control electronics 24 may also be referred to as a battery management system.

The rechargeable battery 2 also comprises a data interface as part of the communication circuit for bilateral communication between the rechargeable battery 2 and the power tool 1. The data interface of the rechargeable battery 2 is not illustrated in the figures.

The energy storage cells 23 may also be referred to as rechargeable battery cells and serve for taking up, storing and providing electrical energy or an electrical voltage. The energy storage cells 23 are cells based on a lithium ion technology, wherein each rechargeable battery cell has an electrical voltage between 2.7 V and 4.2 V.

The rechargeable battery interface 22 is positioned on one side of the housing 21. The rechargeable battery interface 22 comprises a number of power connectors for taking up and delivering electric current and also data connectors for transmitting and receiving signals between the power tool 1 and the rechargeable battery 2. The electric current from the energy storage cells 23 can be delivered by way of the power connectors. The data connectors are not illustrated in the figures.

The power connectors of the rechargeable battery 2 are connected to the power connections of the power tool 2. Similarly, the data connectors of the rechargeable battery 2 are connected to the data connections of the power tool 1.

Through the connection, electrical energy can flow from the energy storage cells 23 of the rechargeable battery 2 to the power tool 1. Furthermore, signals can be exchanged for communication between the rechargeable battery 2 and the power tool 1.

Figure 2:
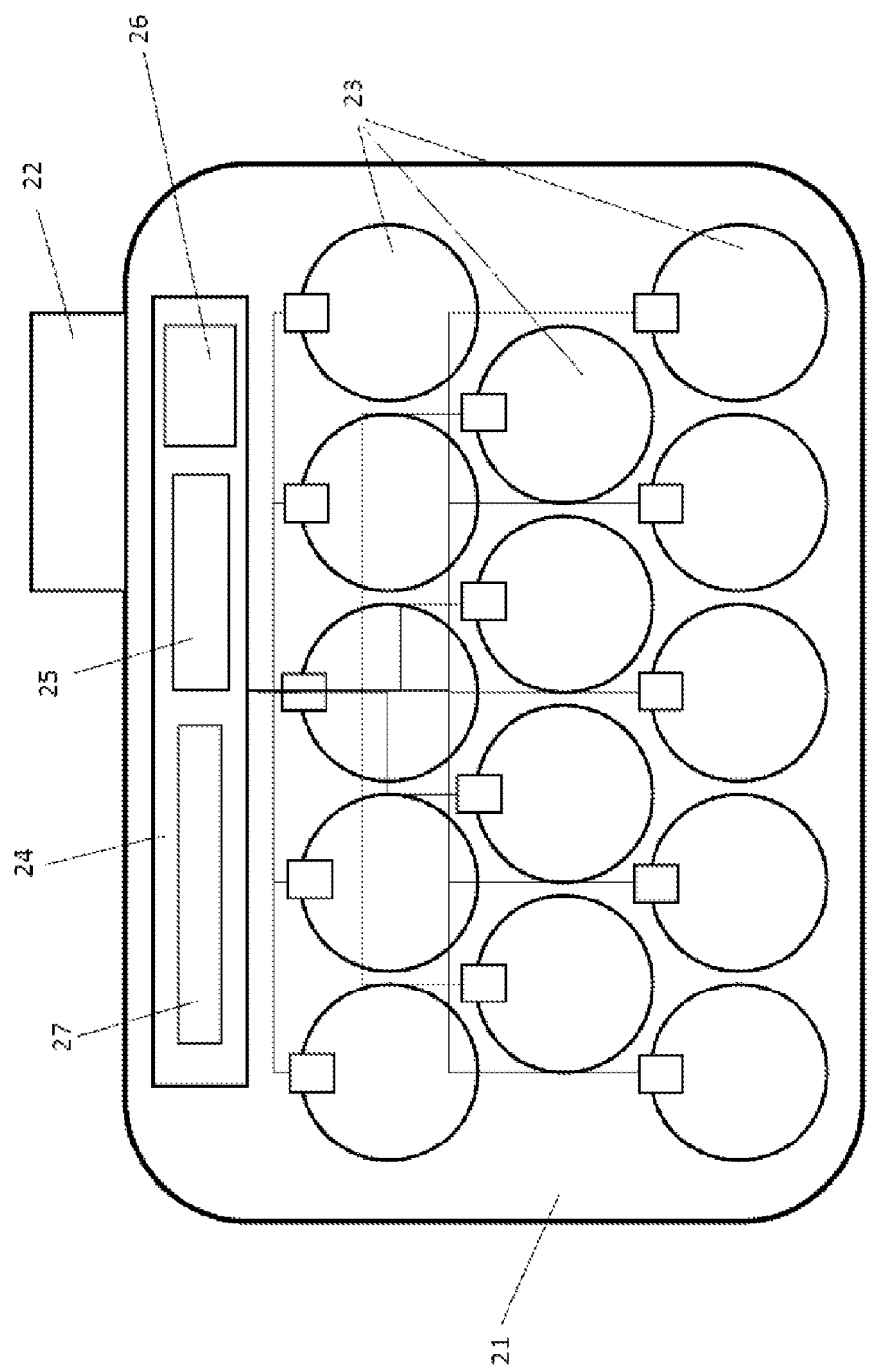
FIG. 2 shows a sectional view of the rechargeable battery having a number of energy storage cells, a control device, a voltage measurement device and a sensor device.
Figure 3:
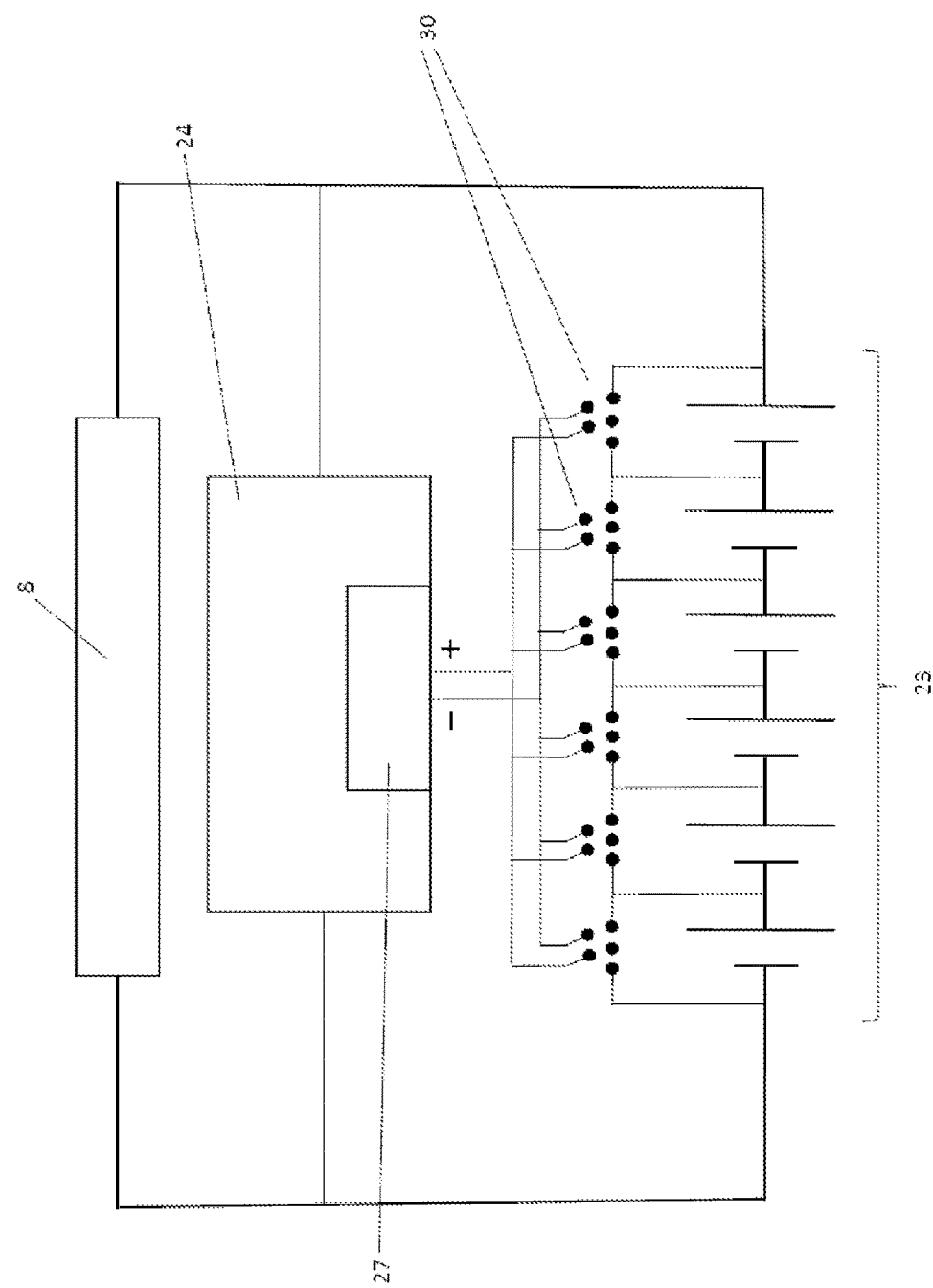
FIG. 3 shows a circuit diagram for carrying out the method according to the invention.

As can be gathered from FIGS. 2 and 3, each energy storage cell 23 is respectively connected to the control electronics 24 and to the voltage measurement device 26 via a controllable switching element 30. As a result of the connection, the voltage measurement device 26 can capture or measure the electrical voltage at each energy storage cell 23.

In the exemplary embodiment cited, the controllable switching element 30 is in the form of a MOSFET. The switching element 30 can be controlled by means of a signal or an electric current and can be reversibly set to an activation mode or deactivation mode. Control is effected by means of the control electronics 24. In the deactivation mode, the switching element 30 is set in such a manner that an electrical line is open and the electrical line is therefore interrupted. In contrast, in the activation mode, the switching element is set in such a manner that an electrical line is closed.

A non-uniform distribution of charge in the rechargeable battery cells 23 can be captured by means of the voltage measurement device 26 and the control electronics 24. However, a non-uniform distribution of charge in the rechargeable battery cells 23 is present only when a predetermined threshold value is reached or a predetermined threshold value for the charge difference between two rechargeable battery cells 23 is reached. In order to distribute charge in the rechargeable battery cells 23 as uniformly as possible, the switching element 30, which is connected to the rechargeable battery cell 23 with the highest state of charge, is controlled by means of the control electronics 24. Controlling the switching element 30 closes the switching element 30 and the corresponding line, with the result that electrical energy flows from the rechargeable battery cell 23 with the highest state of charge to the control electronics 24. The electrical energy is conducted from the control electronics 24 to the sensor device 27 and is therefore used to supply the sensor device 27 with electrical energy.

The electrical voltage or the state of charge of the individual rechargeable battery cells 23 is captured or measured at regular intervals of time.

Figure 4:
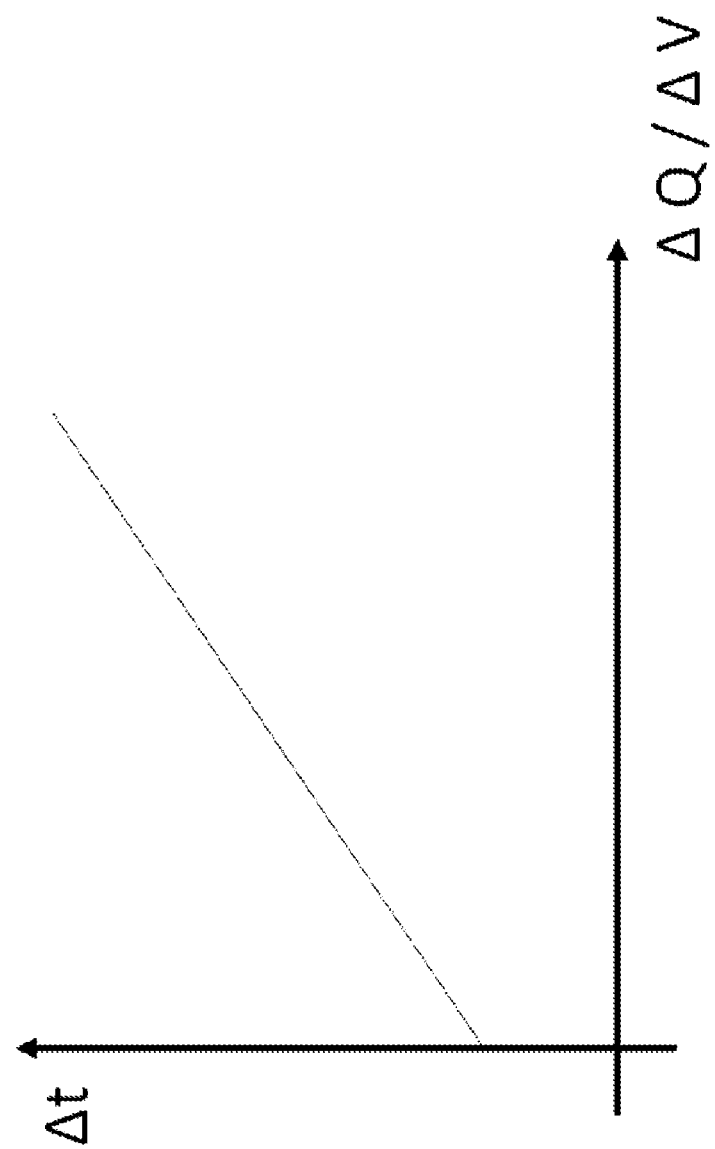
FIG. 4 shows a graphical illustration of the ratio of the change in a second period to the change in an electrical voltage.

According to a further embodiment, it may also be possible for the electrical voltage $\Delta V$ or the state of charge $\Delta Q$ (Ah) of the individual rechargeable battery cells 23 to be captured or measured at irregular intervals of time $\Delta t$ (cf. FIG. 4). For example, it is possible for the interval of time between a first capturing operation and a second capturing operation to be dependent on the difference value between the highest state of charge of a first rechargeable battery cell 23 and the lowest state of charge of a second rechargeable battery cell 23. The greater the difference value between a highest state of charge and a lowest state of charge, the shorter the interval of time between a first operation and a second operation of capturing the electrical voltage or the state of charge of the individual rechargeable battery cells 23.

The interval of time may likewise be dependent on the increase in the difference between the highest state of charge and the lowest state of charge of the rechargeable battery cells 23. The faster the difference between the highest state of charge and the lowest state of charge, the shorter the interval of time between a first operation and a second operation of capturing the electrical voltage or the state of charge of the individual rechargeable battery cells 23.

Furthermore, the interval of time may be dependent on the decrease in the difference between the highest state of charge and the lowest state of charge of the rechargeable battery cells 23 if adjustment of the different states of charge (balancing of the rechargeable battery cells 23) has already been started by the control electronics 24. In other words: the faster the adjustment between the highest state of charge and the lowest state of charge, the shorter the interval of time between a first operation and a second operation of capturing the electrical voltage or the state of charge of the individual rechargeable battery cells 23.

The invention claimed is:

1. A method for controlling and regulating a rechargeable battery having at least one first and one second energy storage cell, control electronics, a voltage measurer and at least one sensor, wherein the sensor and the first and second energy storage cells are respectively connected to one another via at least one controllable switch in such a manner that electrical energy can be conducted from the first and second energy storage cells to the sensor, the method comprising the steps of:
 capturing a first voltage value of the first and second energy storage cells via the voltage measurer; and
 adjusting the at least one switch from a deactivation mode to an activation mode if the difference between the first voltage value of the first energy storage cell and the first voltage value of the second energy storage cell reaches a predetermined threshold value, in order to conduct electrical voltage from the energy storage cell of the first and second energy storage cells with the higher voltage value to the sensor.

2. The method as recited in claim 1 further comprising capturing a second voltage value of the first and second energy storage cells via the voltage measurer after expiry of a first period.

3. The method as recited in claim 2 wherein the first time period is independent of the first voltage value of the first and second energy storage cells.

4. The method as recited in claim 1 further comprising capturing a second voltage value of the first and second energy storage cells via the voltage measurer after expiry of a dependent time period, wherein the dependent time period depends on a difference value between the first voltage value of the first energy storage cell and the first voltage value of the second energy storage cell.

5. The method as recited in claim 1 wherein the rechargeable battery is connectable to a power tool, the power tool having a housing, a handle, a base part, a tool fitting, an electric drive, a controller and an interface, the interface interacting with a battery interface of the rechargeable battery.

6. The method as recited in claim 1 wherein the rechargeable battery also is used for powering the electric drive.

7. The method as recited in claim 1 wherein the first and second energy storage cells are lithium ion battery cells each with an electrical voltage between 2.7 V and 4.2 V.

8. The method as recited in claim 1 wherein the sensor is selected from the group consisting of an acceleration sensor, a GPS sensor, a gyro sensor, and a temperature sensor.

* * * * *